(12) United States Patent
Noda (10) Patent No.: US 6,480,983 B2
(45) Date of Patent: *Nov. 12, 2002

(54) CODE STATE DETERMINING METHOD AND ENCODING APPARATUS

(75) Inventor: Makoto Noda, Tokyo (JP)

(73) Assignee: Sony Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/290,736

(22) Filed: Apr. 13, 1999

(65) Prior Publication Data

US 2002/0133782 A1 Sep. 19, 2002

(30) Foreign Application Priority Data

Apr. 28, 1998 (JP) .......................... 10-118651

(51) Int. Cl.[7] .................. H03M 13/03; H04L 23/02; H04L 5/12
(52) U.S. Cl. ...................... 714/792; 375/265
(58) Field of Search ................. 714/792, 786, 714/787, 788, 790, 791, 793, 794, 795, 796, 797; 375/265

(56) References Cited

U.S. PATENT DOCUMENTS 5,095,484 A * 3/1992 Karabed et al. ............ 714/746
5,177,482 A * 1/1993 Cideciyan et al. ............ 341/59
5,257,272 A * 10/1993 Fredrickson ................ 714/792
5,280,489 A * 1/1994 Fredrickson et al. ........ 714/788
5,331,320 A * 7/1994 Cideciyan et al. ............ 341/56
5,548,600 A * 8/1996 Fredrickson et al. ........ 714/792
5,646,950 A * 7/1997 Varanasi et al. ............ 714/792
6,154,504 A * 11/2000 Ino ............................. 375/265

OTHER PUBLICATIONS

S. Fukuda et al., "8/10 Modulation Codes for Digital Magnetic Recording," IEEE Transactions on Magneitcs, vol. MAG-22, No. 5, Sep. 1986, pp. 1194-1196.

* cited by examiner

Primary Examiner—Albert Decady
Assistant Examiner—Joseph D. Torres
(74) Attorney, Agent, or Firm—Oblon, Spivak, McClelland, Maier & Neustadt, P.C.

(57) ABSTRACT

A code state determining method for spectral-null type trellis code of which the number of states of start points and end points of code words is restricted to two or more is disclosed, that comprises the step of determining states of end points of code corresponding to a state-determination state transition diagram of which prohibited output code is newly assigned as an additional path to a code output prohibited state of a state transition diagram having a particular restriction with respect to a cumulated value.

5 Claims, 9 Drawing Sheets

ADDITIONAL PATH

| STATE | 1 | 2 | 3 | 4 | 5 | 6 | 7 | 8 |
|---|---|---|---|---|---|---|---|---|
| 1 | 00 | 00 | 01 | 10 | 11 | 11 | 01 | 10 |
| 4 | 01 | 10 | 00 | 00 | 01 | 10 | 11 | 11 |
| 5 | 11 | 11 | 10 | 01 | 00 | 00 | 10 | 01 |
| 8 | 10 | 01 | 11 | 11 | 10 | 01 | 00 | 00 |

ADDITIONAL PATH 0

CODE STATE DETERMINING METHOD AND ENCODING APPARATUS

BACKGROUND OF THE INVENTION

1. Field of the Invention

The present invention relates to a code state determining method and an encoding apparatus that encodes spectral-null type trellis code for example DC-free code or Nyquist-free code used for a magnetic recording/reproducing apparatus, a magneto-optical disc apparatus, or the like that stores computer data.

2. Description of the Related Art

Figure 1:
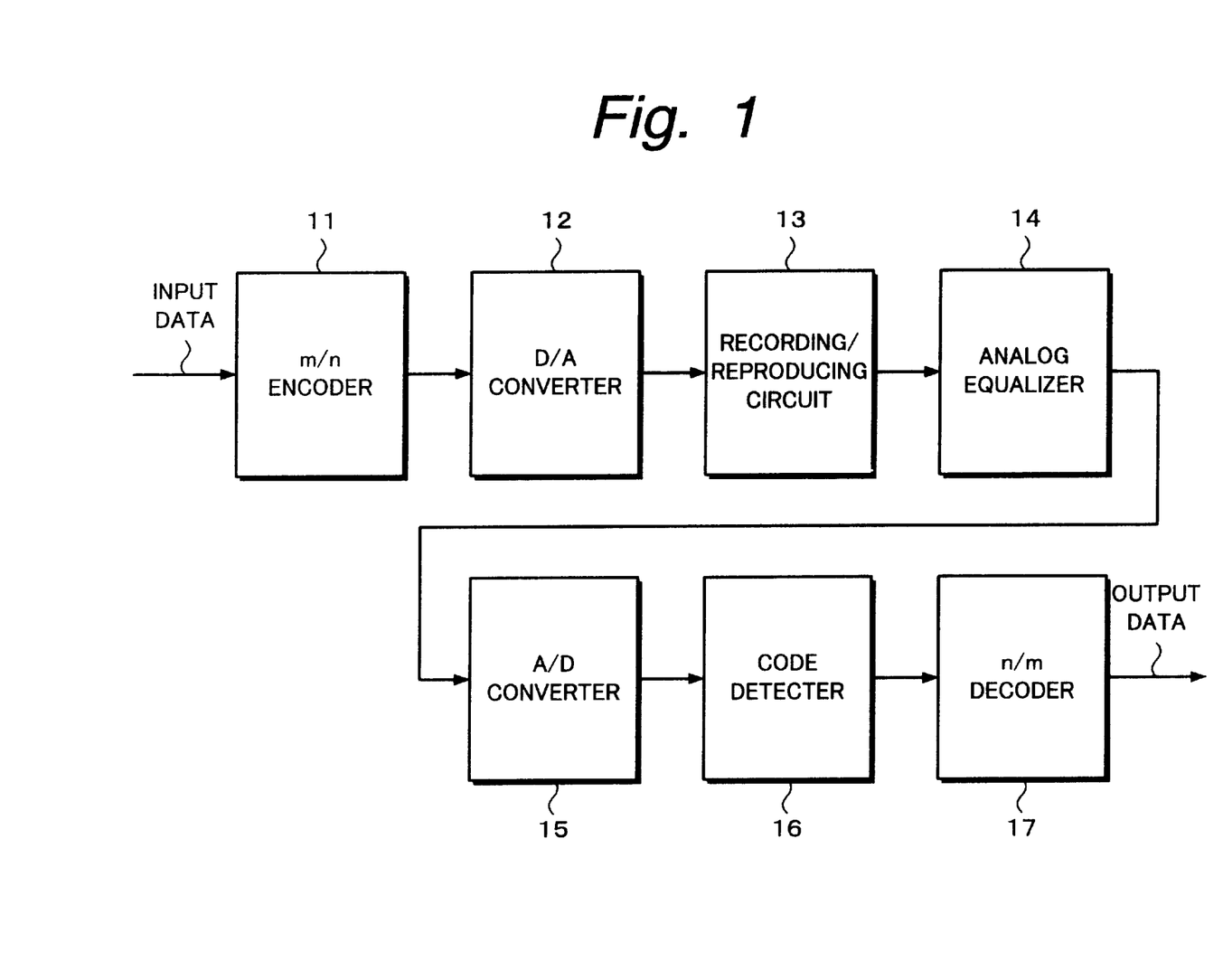
FIG. 1 is a block diagram for explaining a digital signal process of a conventional recording/reproducing apparatus.

Next, with reference to FIG. 1, a signal process system for use with a conventional recording/reproducing apparatus will be described. Input data is supplied to an m/n encoder 11. The m/n encoder 11 converts the input data into code with a relation of m:n (where m is the bit length of non-encoded data; and n is the bit length of encoded data). The m/n encoder 11 supplies the resultant code to an D/A converter 12. The D/A converter 12 converts the code received from the m/n encoder 11 into a record square wave. The record square wave is supplied to a recording/reproducing circuit 13. The recording/reproducing circuit 13 drives for example a magnetic head or an optical pickup (not shown) so as to record data to a record medium such as a magnetic disc or a magneto-optical disc.

On the other hand, a signal reproduced from a record medium by the magnetic head or the optical pickup is supplied to an analog equalizer 14. The analog equalizer 14 equalizes the reproduced signal into a signal with a particular equalized characteristic. The resultant signal is supplied to an A/D converter 15. The A/D converter 15 converts the output signal of the analog equalizer 14 into a digital signal. The digital signal is supplied to a code detector 16. The code detector 16 detects code from the output signal of the A/D converter 15. The resultant signal is supplied to an n/m decoder 17. The n/m decoder 17 converts the output signal of the code detector 16 into a signal with a relation of n:m. When the analog equalizer 14 does not sufficiently equalize the output signal of the recording/reproducing circuit 13, a digital equalizer may be disposed between the A/D converter 15 and the code detector 16. In recent years, a maximum likelihood detector has been commonly used as the code detector 16.

The code used in the recording/reproducing system is designed corresponding to a predetermined state transition diagram. Thus, when there are a plurality of states of start points and end points of code, it is necessary to determine the states of end points of individual code words that are successively encoded.

Figure 2:
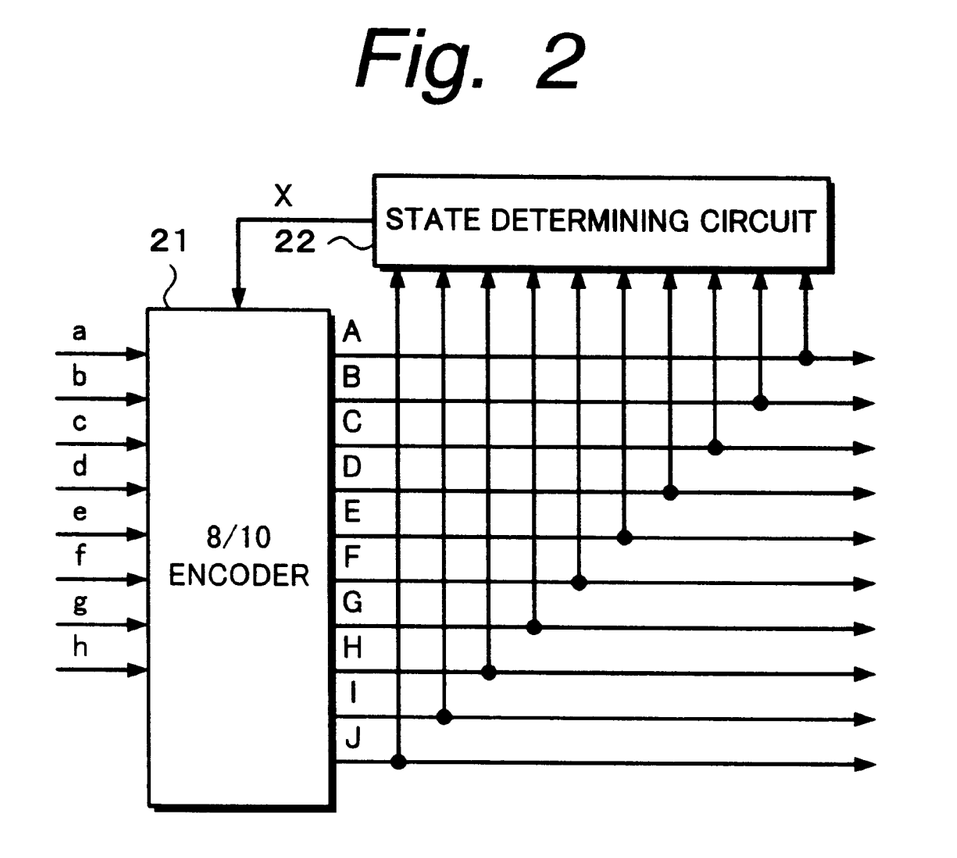
FIG. 2 is a block diagram showing an example of the structure of an encoding apparatus that generates 8/10 conversion code of which the number of states of start points and end points of code is two.

Next, with reference to FIG. 2, a more practical structure of the m/n encoder 11 shown in FIG. 1 will be described in the case that the m/n encoder 11 performs an 8/10 code conversion of which the number of states of start points and end points of code is two. Eight-bit parallel data abcdefgh is input to an 8/10 encoder 21. The 8/10 encoder 21 converts the eight-bit parallel data abcdefgh into 10-bit code ABCDEFGHIJ. The 10-bit code ABCDEFGHIJ is supplied to a downstream circuit for example the D/A converter 12 shown in FIG. 13. In addition, the 10-bit code ABCDEFGHIJ is supplied to a state determining circuit 22.

The state determining circuit 22 determines the states of end points of code. The state determining circuit 22 generates one-bit code X represents one of two states of each end point of code. The one-bit code X is supplied to an 8/10 encoder 21. With reference to the one-bit code X, the 8/10 encoder 21 successively generates 10-bit code.

Example of code that is used for such an encoder are spectral-null type trellis codes (such as DC-free code and Nyquist-free code), RLL (Run Length Limited) code, MTR (Maximum Transition Run) code. In DC-free code, DSV (Digital Sum Value) that is an amplitude value of an accumulated charge such as DC accumulated charge RDS (Running Digital Sum) or the like is restricted to a limited value so that a DC component of the code spectrum on the frequency axis becomes null.

On the other hand, in Nyquist-free code, ASV (Alternating Digital Sum Value) that is am amplitude value of an AC accumulated charge ADS (Alternating Digital Sum) is restricted to a limited value so that a Nyquist frequency component of the code spectrum on the frequency axis becomes null. Conventionally, in many types of tape storage systems such as a digital audio tape recorder (R-DAT) and an 8-mm advanced intelligent tape system (AIT), 8/10 conversion DC-free code whose DSV is six has been widely used.

On the other hand, in RLL code, the maximum number of successive "0s" of pre-NRZI-modulated code is limited (constant). In MTR code, the maximum number of successive "1s" of pre-NRZI-modulated code is limited (constant).

With respect to RLL code or MTR code of which only the maximum number of successive "1s" or "0s" is defined, the state can be easily determined by counting the number of successive "1s" or "0s" after an end point of code. On the other hand, in spectral-null type trellis code such as DC-free code or Nyquist-free code, it is not easy to determine the state of an end point of code.

Figure 3:
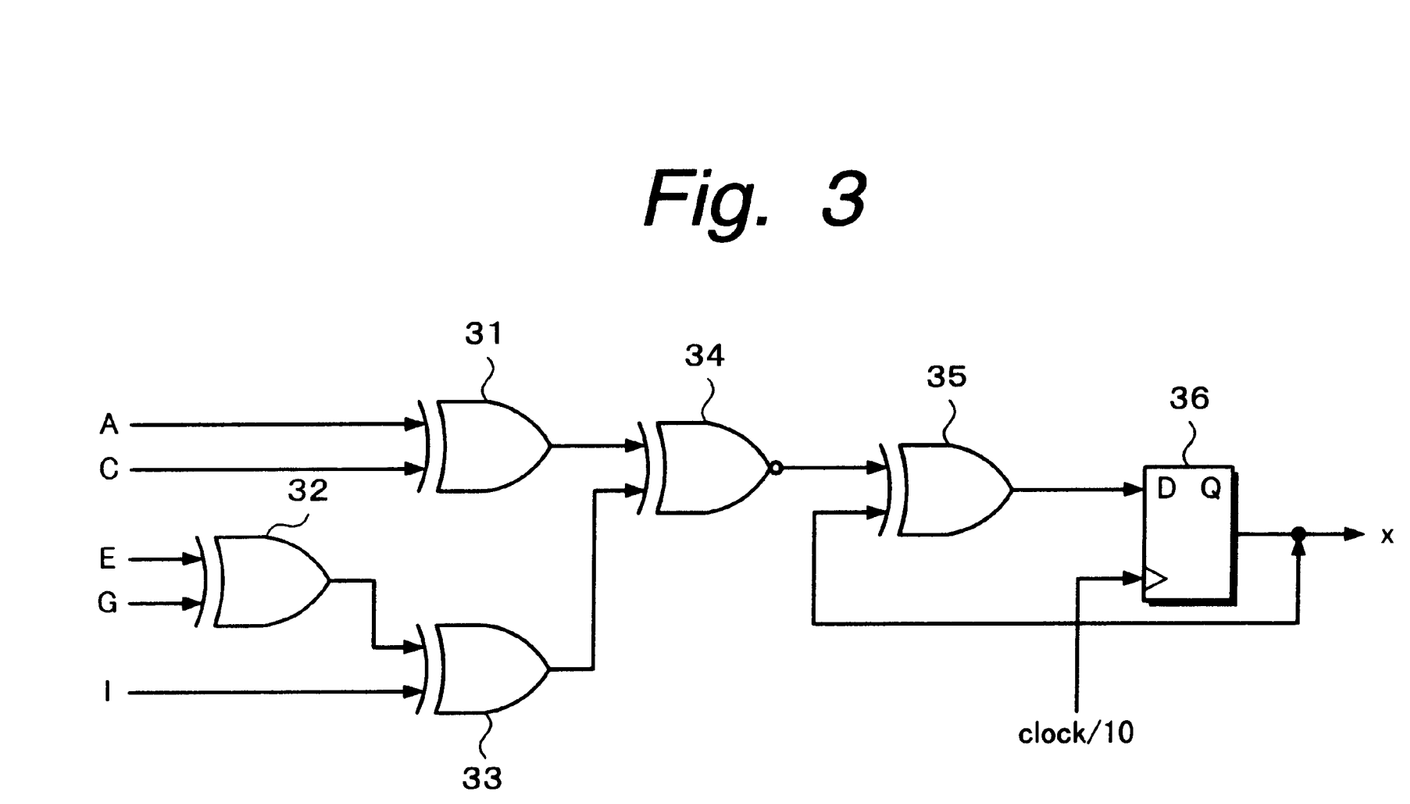
FIG. 3 is a block diagram showing an example of the structure of a state determining circuit for 8/10 conversion DC-free code.

FIG. 3 is a flow chart showing an example of the structure of a state determining circuit used in an encoding apparatus that encodes 8/10 conversion DC-free code. An example of such a state determining circuit has been disclosed by S. Fukuda, Y. Kojima, Y. Shinpuku, and K. Okada, "8/10 Modulation Codes for Digital Magnetic Recording, IEEE Trans. on Magn. vol. MAG-22, No. 5, pp. 1194–1196, September 1986". The circuit is composed of five EXOR (Exclusive Or) circuits 31, 32, 33, 34 and 35 and one flip-flop 36. Assuming that one EXOR circuit is composed of three gates and that one flip-flop is composed of eight gates, the state determining circuit is composed of around 23 gates.

In the structure shown in FIG. 3, states are determined corresponding to only odd bits A, C, E, G, and I. The structure is accomplished due to the following fact that was discovered with respect to two-state DC-free code. In other words, in two-state DC-free code, when the value of {mod 2 (sum of odd bits of code)} is 0, a state inversion takes place.

Figure 4:
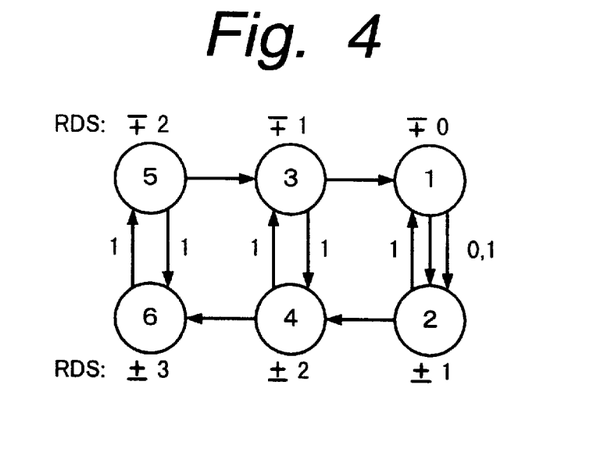
FIG. 4 is a schematic circuit showing an example of a state transition diagram having six states (DSV=6) of code that is NRZI modulated.

FIG. 4 is a schematic diagram showing an example of a state transition diagram for generating 8/10 conversion DC-free code. The state transition diagram has six states (DSV=6) of code that is NRZI modulated. In the conventional 8/10 conversion DC-free code, as shown in FIG. 4, states of end points and start point of code are state 2 or state 3.

DC-free code whose each bit is inverted from "0" to "1" or vice versa is Nyquist-free code. Thus, with respect to DC-free code and Nyquist-free code, code can be generated and determined using almost similar method.

As described above, in an example of the conventional two-state 8/10 conversion DC-free code, the state of an end point of code can be determined corresponding to the sum of odd bits. However, such a method has been accomplished by a discovery approach. Thus, the method cannot be generally applied to spectral-null code such as DC-free code or Nyquist free-code.

On the other hand, when the number of states of end points and start points of code words is increased from two to three or four, since the number of code words that can be generated increases, the encoding efficiency of available code may improve. However, if the state determination of such code is performed by hardware, the number of bits of a signal that represents determined states increases. In other words, when the number of states of end points and start points of code is two, the number of bits of the signal that represents the determined states is one. On the other hand, when the number of states of end points and start points of code is three or four, the number of bits of the signal that represents determined results becomes two. Thus, the structure of the state determining circuit becomes complicated.

So far, various converting methods including a method of which the number of states of start points and end points of code is three have been proposed. However, above-described problem has not been solved in such methods.

OBJECTS AND SUMMARY OF THE INVENTION

Therefore, an object of the present invention is to provide a state determining method that can be universally applied to spectral-null type trellis code such as DC-free code and Nyquist-free code of which the number of states of start points and end points of code is three or more. Another object of the present invention is to provide an encoding apparatus that performs an encoding process corresponding to such a state determining method.

A first aspect of the present invention is a code state determining method for spectral-null type trellis code of which the number of states of start points and end points of code words is restricted to two or more, comprising the step of determining states of end points of code corresponding to a state-determination state transition diagram of which prohibited output code is newly assigned as an additional path to a code output prohibited state of a state transition diagram having a particular restriction with respect to a cumulated value.

A second aspect of the present invention is an encoding apparatus for encoding spectral-null type trellis code of which the number of states of start points and end points of code words is restricted to two or more, comprising a means for determining states of end points of code corresponding to a state-determination state transition diagram of which prohibited output code is newly assigned as an additional path to a code output prohibited state of a state transition diagram having a particular restriction with respect to a cumulated value.

According to the present invention, since a tracking process is performed corresponding to a state-determination state transition diagram created corresponding to a code-generation state transition diagram, the states of end points of code can be determined.

In this case, since the state-determination state transition diagram can be created in a conventional manner of which an additional path is assigned to the diagram, the method can be applied to code of which the number of states of start points and end points of code is three or more. Thus, the state determination can be universally performed. These and other objects, features and advantages of the present invention will become more apparent in light of the following detailed description of a best mode embodiment thereof, as illustrated in the accompanying drawings.

DETAILED DESCRIPTION OF THE PREFERRED EMBODIMENTS

Figure 5:
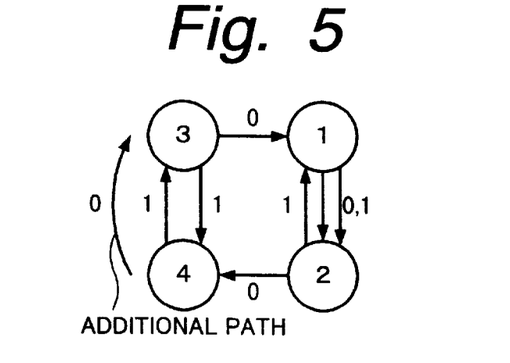
FIG. 5 is a schematic diagram showing a state-determination transition diagram according to a first embodiment of the present invention.

Next, a first embodiment of the present invention will be described. FIG. 5 is a schematic diagram showing an example of a state-determination state transition diagram used for tracking states from a start point to an end point corresponding to an output signal. The tracking operation is also referred to as tracing operation. In the state transition diagram, an additional path is assigned to a four-state transition diagram for generating code whose DSV is 4. The additional path causes output code 0 that is prohibited in state 4 to be output to state 3. In the state transition diagram shown in FIG. 5, since there is no prohibited output code, when code is generated corresponding to the state transition diagram, the DSV of code is not restricted.

In the tracking operation, when DSV of code is four or less, the path of the output code 0 assigned to the state 4 may be transited to any state. However, since the number of generated code words of code whose DSV is four or less is small, the code is not actually used. Thus, a state-determination state transition diagram of which the path of data 0 is transited to other than state 3 is not practical.

The intensive study conducted by the inventor of the present invention shows that when states of DC-free code of which start points and end points of code words are restricted to states 1, 2, 3, and 4 are tracked corresponding to the state transition diagram shown in FIG. 5, the states of at least start points and end points of code words are correctly represented for all DSV of code.

In other words, the state determining method and encoding apparatus according to the first embodiment of the present invention can be applied to an encoding process of DC-free code or Nyquist-free code of which the number of states of start point and end point of code is restricted to two. The states of end points of code are determined (tracked) corresponding to a newly assigned state transition diagram of which prohibited output code is assigned as an additional path to a state transition diagram whose DSV (ASV) is restricted to four.

Figure 6:
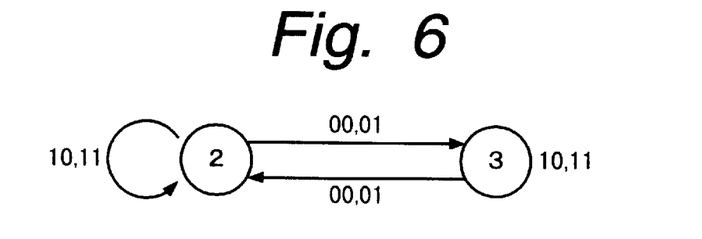
FIG. 6 is a schematic diagram showing an example of a two-state transition diagram of which the state transition diagrams shown in FIG. 5 is represented as a two-bit format.

FIG. 6 is a schematic diagram showing an example of a state transition diagram of which the state transition diagram shown in FIG. 5 is represented as a two-bit format. In a state transition diagram for restricting DSV of code is restricted, when the states of the code are observed at intervals of two bits, the number of states is halved. From FIG. 6, it is clear that such a characteristic applies to the state transition diagram shown in FIG. 5.

Since the state transition diagram shown in FIG. 6 has two states, all states of two-state DC-free code of which states 2 and 3 are start points and end points of code words can be expressed with one bit regardless of DSV of code. In other words, when the state of code is tracked corresponding to the state transition diagram shown in FIG. 5 or 6 and the absolute value of RDS in the middle of code words exceeds two, states are not correctly represented, However when the absolute value of RDS restores to two or less, the states of the code can be correctly determined.

Assuming that one-bit code X that represents two states and X=0 and X=1 represent state 2 and state 3, respectively (alternatively, X=0 and X=1 may represent state 3 and state 2, respectively) and that odd bits and even bits of the code are denoted by, P and Q, respectively, two-bit format X can be expressed in the following Boolean algebra notation.

$$x = \overline{X \oplus P}$$

In this case, the two-bit format state determining circuit can be composed of one EXNOR (Exclusive Not OR) circuit.

Figure 7:
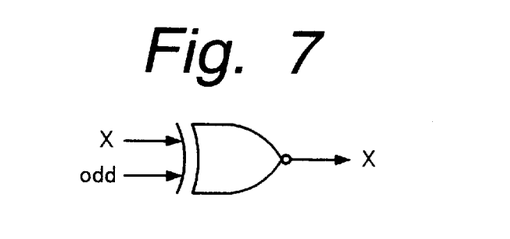
FIG. 7 is a block diagram showing an example of a two-bit format basic structural circuit that determines the states of two-state DC-free code of which states 2 and 3 are start points and end points of code words according to the first embodiment.

FIG. 7 is a block diagram showing an example of the structure of a state determining circuit that determines the states of two-state DC-free code of which states 2 and 3 are start points and end points of code words corresponding to the state determining method of the present invention. When the code word length of conversion code is 10 bits, five basic structural circuits shown in FIG. 7 are connected in series.

Figure 8:
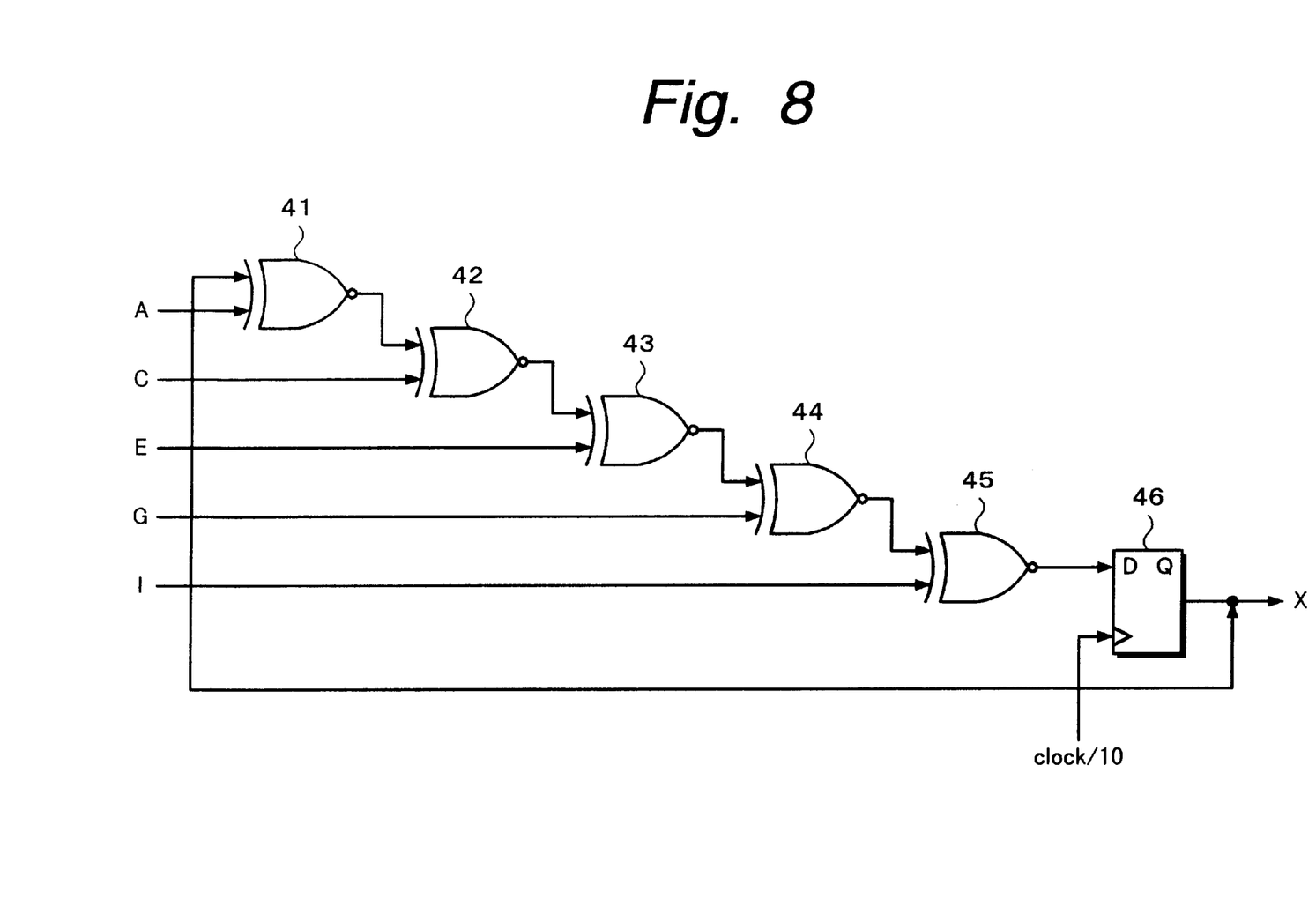
FIG. 8 is a block diagram showing an example of the structure of a two-state 10-bit DC-free state determining circuit of which states 2 and 3 are start points and end points of code words according to the first embodiment.

FIG. 8 is a block diagram showing an example of the structure of a two-state 10-bit DC-free code state determining circuit of which states 2 and 3 are start points and end points of code words corresponding to the state determining method according to the first embodiment of the present invention. The example shown in FIG. 8 is composed corresponding to a state-determination state transition diagram of which the state transition diagram whose DSV is 4 shown in FIG. 6 is modified. The state determining circuit shown in FIG. 8 is composed of five EXNOR circuits 41, 42, 43, 44, and 45 and one flip-flop 46. The circuit scale of the state determining circuit shown in FIG. 8 is the same as that shown in FIG. 3. Thus, the state determining circuit shown in FIG. 8 is composed of around 23 gates.

The state determining circuit shown in FIG. 8 is equivalent to the state determining circuit shown in FIG. 3. However, the state determining method according to the present invention is generalized with a clear state transition diagram unlike with the conventional state determining method that has been accomplished by a discovery approach.

Thus, according to the first embodiment of the present invention, state determining portions that encode even bit code of which states 2 and 3 are start points and end points of code, odd bit code of which states 1 and 4 are start points and end points of code, odd bit code of which states 2 and 3 are start points of code and states 1 and 4 are end points of code, and odd bit code of which states 1 and 4 are start points of code and states 2 and 3 are end points of code corresponding to the state-determination state transition diagram shown in FIG. 6 can be easily structured.

The first embodiment of the present invention is applied to an encoding process for two-state code. In addition, since the state determining method according to the present invention is generalized corresponding to a clear state transition diagram, the state determining method can be easily applied to code with a larger number of states of start points and end points of code.

Figure 9:
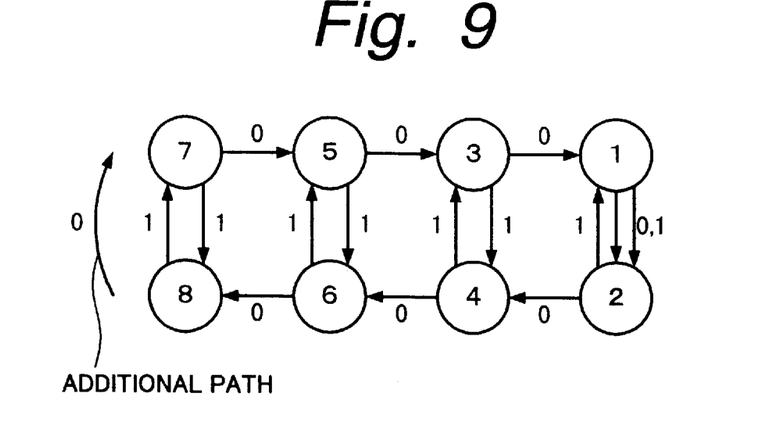
FIG. 9 is a schematic diagram showing an example of a state-determination state transition diagram according to a second embodiment of the present invention.

Next, an example of such an application will be described as a second embodiment of the present invention. FIG. 9 is a schematic diagram showing a transition diagram having eight states (DSV=8) for code that is NRZI modulated and having an additional path that outputs output code 0 prohibited in state 8 to state 7 as with the state transition diagram shown in FIG. 6. In the state transition diagram shown in FIG. 9, there is no prohibited output code. Thus, when code is generated corresponding to the state transition diagram shown in FIG. 9, DSV of code is not restricted.

The intensive study conducted by the inventor of the present invention shows that when states of DC-free code with restricted DSV of which start points and end points of code words are states 1, 2, 3, 4, 5, 6, 7, and 8 are tracked corresponding to the state transition diagram shown in FIG. 9, the states of at least start points and end points of code words can be correctly represented for all DSV of code.

In other words, the second embodiment of the present invention is applied to an encoding process for DC-free code or Nyquist-free code of which the number of states of start points and end points of code is restricted to three or four. In the state that a code output is prohibited for a state transition diagram of which the number of DSV or ASV is restricted to eight, the states of end points of code are determined corresponding to a state transition diagram with an additional path of the prohibited output code.

Figure 10:
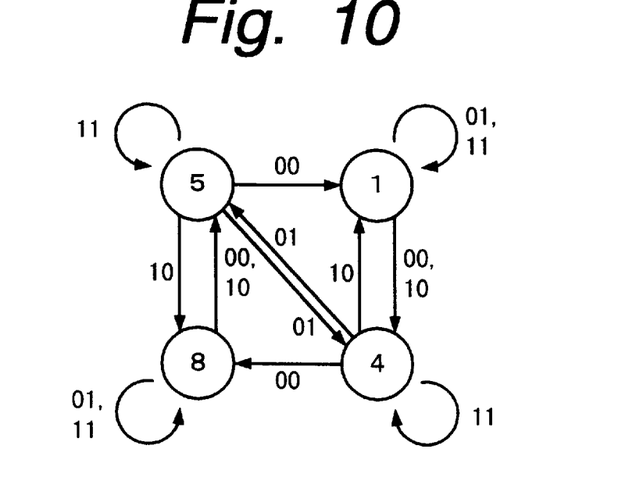
FIG. 10 is a schematic diagram showing an example of a two-state transition diagram of which the state transition diagrams shown in FIG. 9 is represented as a two-bit format.

FIG. 10 is a schematic diagram showing an example of a two-bit format state transition diagram of the state transition diagram shown in FIG. 9. It is known that when states of code are observed at intervals of two bits corresponding to a state transition diagram that restricts DSV of code, the number of states is halved. FIG. 10 shows that such a characteristic is maintained in the state transition diagram shown in FIG. 9.

Since the state transition diagram shown in FIG. 10 has four states, it is clear that two-state DC-free code of which states 1, 4, and 5 or states 1, 4, 5, and 8 are start points and end points of code words can be represented with one bit regardless of DSV of code even in the middle of code words. In other words, when states of code are tracked corresponding to the state transition diagram shown in FIG. 9 or 10, even if the absolute value of RDS exceeds 4 in the middle of code words, although the states cannot be correctly represented, when the absolute value of RDS restores to four or less, the correct states of code can be determined.

However, in this case, when two-bit code that represents four states is denoted by XY and assigned to states 1, 4, 5, and 8 of the state transition diagram shown in FIG. 10, there are 4!=24 combinations. The complexity of the circuit depends on the selection of one of 24 combinations. The intensive study conducted by the inventor of the present invention shows that the code XY can be assigned to each of the states 1, 4, 5, and 8 in one of combinations shown in FIG. 11, In the method shown in FIG. 11, with one bit of the code XY, state 1 can be determined. Likewise, with the other bit of code XY, state 5 can be determined.

Next, such an assigning method will be described in detail. Assuming that XY=00 represents state 1, XY=01 represents state 4, XY=10 represents state 5, XY=11 represents state 8, even bits of code are P, and odd bits of code are Q, XY as two-bit code can be represented in the following Boolean algebra notation.

$$X = XP + \overline{YP}$$

$$Y = \overline{X} \oplus QP + \overline{Y} \oplus QP$$

Figure 11:
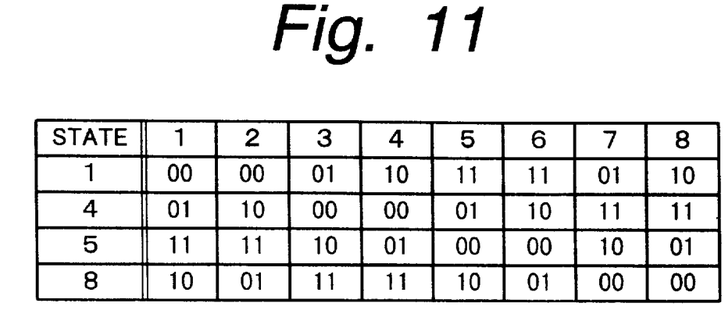
FIG. 11 is a table showing an eight-combination assigning method for simplifying the structure of the state determining circuit.

In this case, the two-bit format state determining circuit can be composed of four AND (or NOR) circuits, two OR (or NOR) circuits, and two EXNOR circuits. When one AND circuit is composed of one gate, one OR gate is composed of one gate, and one EXNOR circuit is composed of three gates, the circuit scale of the state determining circuit becomes around 12 gates. When a code assigning method that is not shown in FIG. 11 is used, the circuit scale of the state determining circuit is similar to that of the above-described example.

On the other hand, in one of combinations as the code assigning method shown in FIG. 11, assuming that XY=00 represents state 1, XY=01 represents state 4, XY=11 represents state 5, and XY=10 represents state 8, the two-bit code XY can be represented in the following Boolean algebra notation.

$$X = X(P + \overline{Y}) + \overline{YXP}$$

Thus, in this case, as will be described later, the two-bit format state determining circuit can be composed of two AND (or NOR) circuits, two OR (or NOR) circuits, and one EXNOR circuit. Likewise, assuming that one AND circuit is composed of one gate, one OR circuit is composed of one gate, one EXNOR circuit is composed of three gates, and one 3-in type AND circuit is composed of two gates, the circuit scale of the state determining circuit can be estimated as around eight gates. A state determining circuit corresponding to other than the assigning method shown in FIG. 11 has the similar circuit scale.

Figure 12:
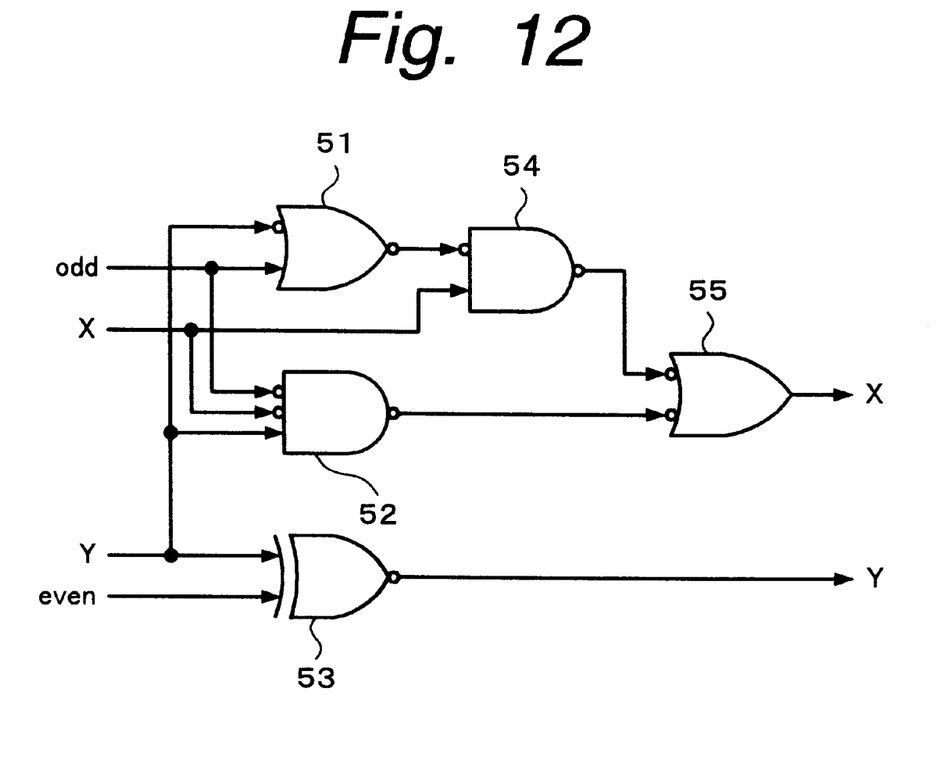
FIG. 12 is a block diagram showing an example of the structure of a two-bit format basic structural circuit that determines the states of two-state DC-free code of which states 1, 4, and 5 or states 1, 4, 5, and 8 are start points and end points of code words according to the second embodiment.

FIG. 12 is a schematic diagram showing an example of a two-bit format basic structural circuit of a three-state or four-state DC-free code state determining circuit of which states 1, 4, and 5 or states 1, 4, 5, and 8 are start points and end points of code words in the case that the first combination of the assigning method shown in FIG. 11 is used corresponding to the state determining method of the present invention. The basic structural circuit is composed of two OR circuits 51 and 55, two AND circuits 52 and 54, and one EXNOR circuit 53. When the code word length of conversion code is for example 10 bits, as with the structure shown in FIG. 8, five basic structural circuits shown in FIG. 12 are connected in series.

However, when the states of code are tracked corresponding to a state transition diagram, the path of data 0 assigned to state 8 in FIG. 8 can be transited to any state other than state 7 as long as DSV of the code is eight or less. The intensive study conducted by the inventor of the present invention shows that a state determining circuit corresponding to a state transition diagram of which an adding path is transited to state 2 can be more simplified than that shown in FIG. 9.

Figure 13:
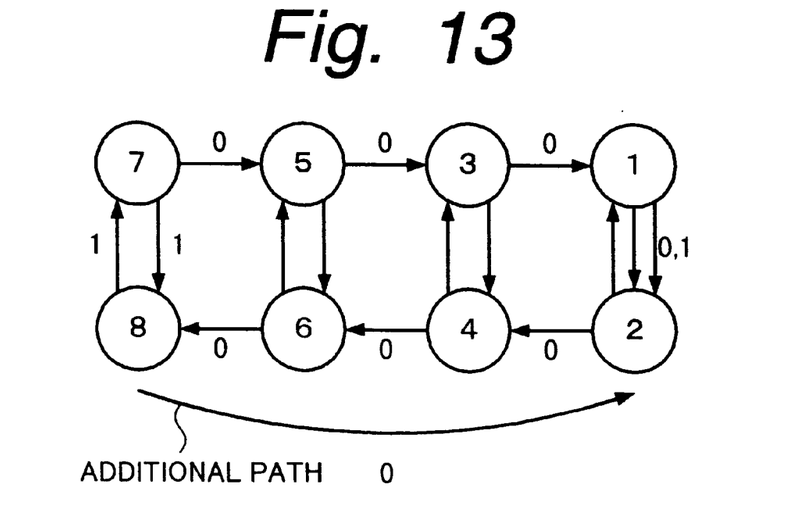
FIG. 13 is a schematic diagram showing an example of a state-determination state transition diagram according to a third embodiment of the present invention.
Figure 14:
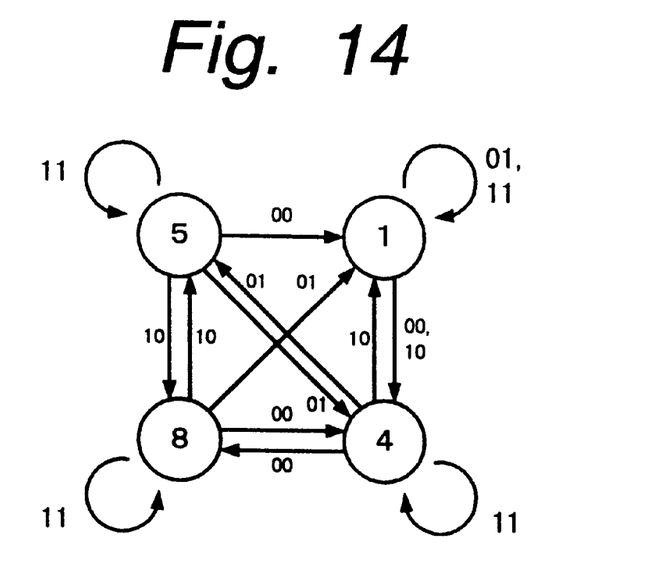
FIG. 14 is a schematic diagram showing an example of a two-state transition diagram of which the state transition diagram shown in FIG. 13 is represented as a two-bit format.

A state-determination state transition diagram of which an additional path of state 8 is transited to state 2 is used. Next, a third embodiment of the present invention will be described. FIG. 13 is a schematic diagram showing an eight-state transition diagram that generates code whose DSV=8 and that is NRZI modulated in the case that DSV of code is restricted to eight or less and that an additional path of which output code "0" prohibited in the state 8 is output to state 2 is assigned. FIG. 14 is a two-bit format state transition diagram of the state transition diagram shown in FIG. 13. When the first combination of the assigning method shown in FIG. 11 is applied in the state transition diagram shown in FIG. 14, two-bit code XY can be represented in the following Boolean algebra notation.

$$X = XP + \overline{YXP}$$

$$Y = \overline{Y \oplus Q}$$

In this case the two-bit format state determining circuit can be composed of two AND (or NOR) circuits, one OR (or NOR) circuit, and one EXNOR circuit. The circuit scale of the two-bit format state determining circuit becomes around 7 gates.

Figure 15:
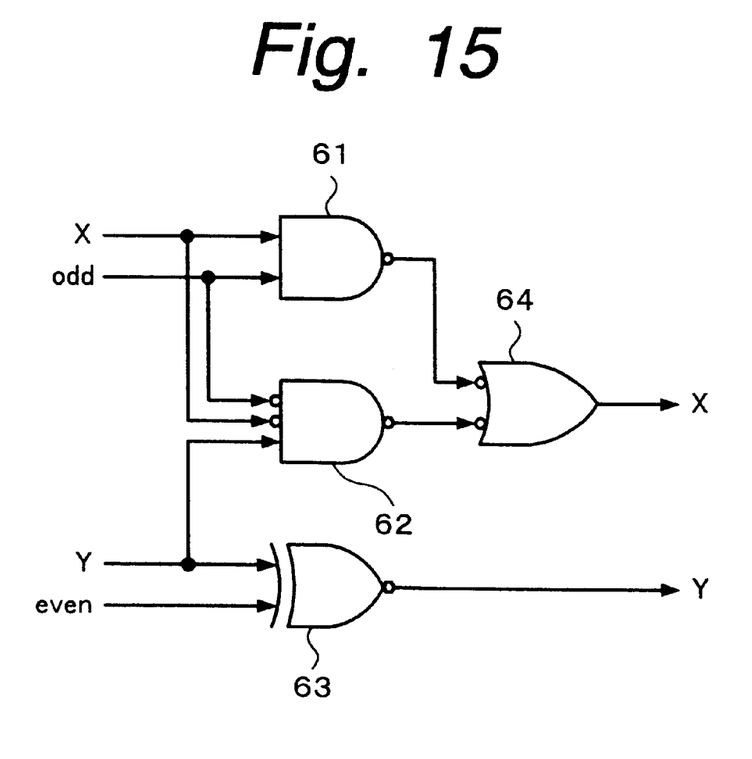
FIG. 15 is a block diagram showing an example of the structure of a two-bit format basic structural circuit that determines the states of two-state DC-free code of which states 1, 4, and 5 or states 1, 4, 5, and 8 are start points and end points of code words according to the third embodiment.

FIG. 15 is a schematic diagram showing an example of a two-bit format basic structural circuit of a three-state or four-state DC-free code state determining circuit according to the third embodiment in the case that states 1, 4, and 5 or states 1, 4, 5, and 8 are start points and end points of code words and of which DSV of the code is restricted to eight or less. The basic structural circuit can be composed of two AND circuits 61 and 62, one EXNOR circuit 63, and one OR circuit 64. When the code word length of the conversion code is 10 bits, five basic structural circuits shown in FIG. 15 are connected in series as with the structure shown in FIG. 8.

Figure 16:
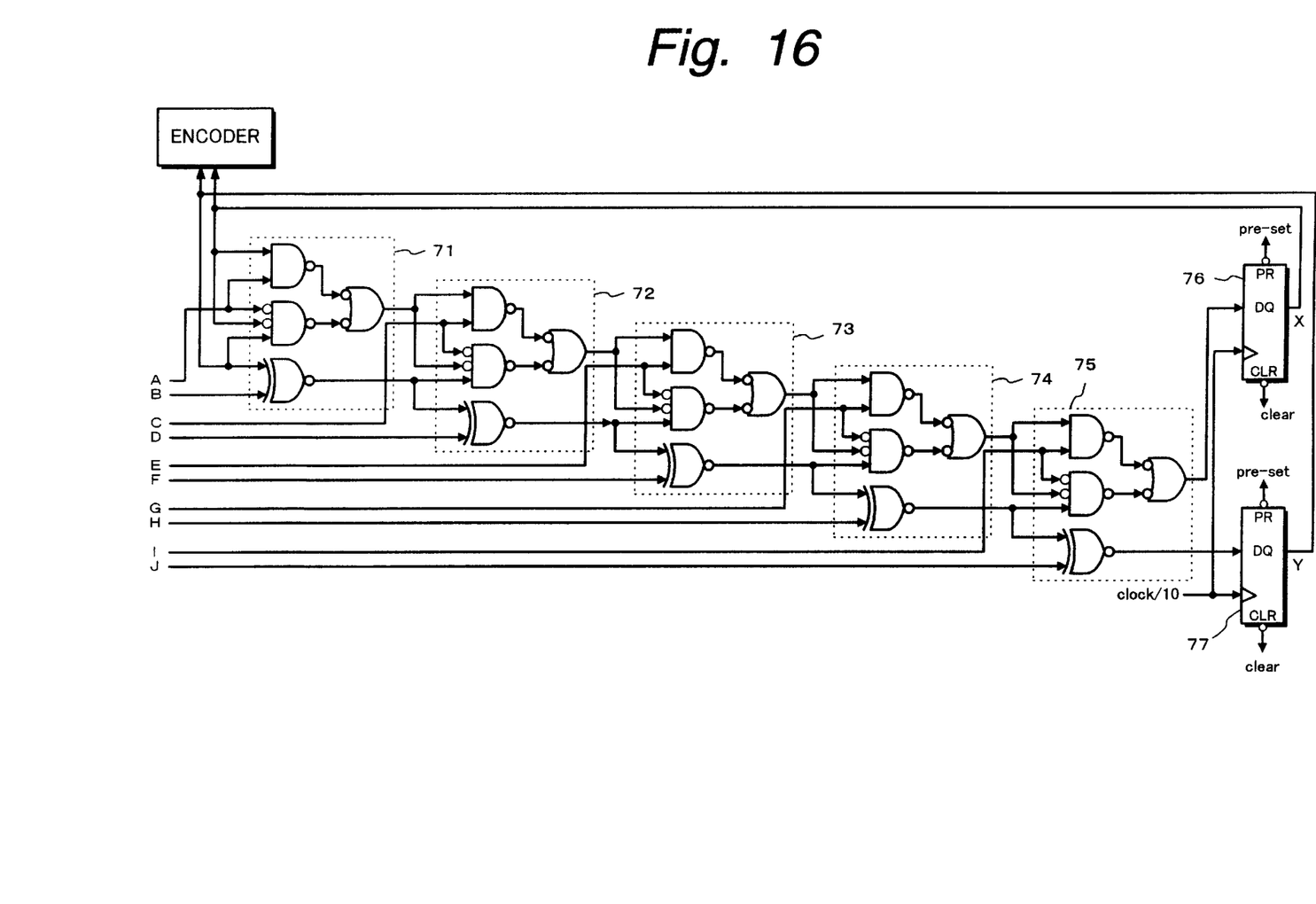
FIG. 16 is a block diagram showing an example of the structure of a state determining circuit that encodes 10-bit code of three-state or four-state DC-free code of which states 1, 4, and 5 or states 1, 4, 5, and 8 are start points and end points in the case that DSV of code is restricted to eight or less according to the third embodiment.

FIG. 16 is a schematic diagram showing an example of a three-state or four-state determining circuit for a 10-bit DC-free code according to the state determining method of the present invention in the case states 1, 4, 5, and 8 are start points and end points of code and DSV is eight or less. Five basic structure circuits 71, 72, 73, 74, and 75 shown in FIG. 15 are connected in series. In addition, two registers 76 and 77 are connected downstream of the basic structural circuit 75. The circuit scale of the state determining circuit becomes around 51 gates.

According to the generalized state determining method of the present invention, the state transition diagrams shown in FIGS. 9 and 13 show that a state determining circuit for other than even-bit DC-free code of which states 1, 4, and 5 or states 1, 4, 5, and 8 are start points and end points of code can be easily structured. For example, state determining circuits for even-bit code of which states 2, 3, 6, 7 are start points and end points of code, odd-bit code of which states 2, 3, 6, and 7 are start points of code and states 1, 4, 5, and 8 are end points of code, odd-bit code of which states 1, 4, 5, and 8 are start points of code and states 2, 3, 6, and 7 are end points of code can be easily structured in the state determining method according to the present invention.

COMPARED EXAMPLE

A state determining circuit for code of which the number of states of start points and end points of code words is three or more has not been practically disclosed. For example, in the state determining circuit for determining states of 10-bit code according to the second embodiment shown in FIG. 3, 10 bits of XY and a code word are input and two bits of XY are output. Thus, the state determining circuit according to the second embodiment performs 12/2 conversion. It is not easy to find a method for simplifying the structure of a state determining circuit that determines states corresponding to input/output data of the 12/2 conversion because there are various combinations.

Experiments for simplifying the structure of a state determining circuit that determines states corresponding to input/output data of 12/2 conversion using a conventional compiler software program show that such a state determining circuit requires 78 gates. Thus, the required hardware scale is around 50% larger than that of the state determining circuit according to the third embodiment shown in FIG. 16.

As is clear from the first embodiment of the present invention, the number of states of the state-determination state transition diagram used in the state determining method and the state determining circuit according to the present invention is preferably $2^N$(N: Integer). In addition, to simplify the structure of the state determining circuit, the number of states is preferably eight or less.

According to the first embodiment of the present invention, a state determining circuit that processes data for two bits at a time is used. Likewise, the present invention can be also applied to state determining circuits that process data for one bit, three bits, and four bits at a time.

As described above, when spectral-null type trellis code of which the number of states of start points and end point of code words is restricted to two or more is encoded, the states of end points of code are determined corresponding to a state-determination state transition diagram of which output code is newly assigned as an additional path to a code output prohibited state of a state transition diagram having a particular restriction (for example, the cumulated value is restricted to $2^N$(N:Integer)).

Thus, states are tracked corresponding to a code-generation state transition diagram created by a conventional method of which an additional path is assigned to a code-generation state transition diagram so as to determine states of end points of code. Consequently, the present invention can be applied to code of which the number of states of start points and end points are three or more. As a result, states can be universally determined.

In addition, states can be tracked with a simply structured code state determining circuit. Thus, for example, a magnetic recording system can be composed at low cost. Consequently, the industrial significance of the present invention is very large.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A method for detecting a next state of a NRZI modulated spectral-null trellis codeword generator, wherein each state corresponds to a starting value of a bounded digital sum variation (DSV) to be calculated for a sequence of NRZI modulated spectral-null trellis codewords, comprising the steps of:

modifying a codeword generation state machine by adding a state transition to form a codeword digital sum variation (DSV) detection state machine, wherein the added state transition is an illegal state transition for the bounded digital sum variation (DSV);

monitoring an output codeword from the codeword generator and a present state of the codeword generator using digital logic configured to implement a state transition of the codeword detection state machine; and outputting a digital code corresponding to the next state of the codeword generator.

2. The method of claim 1, wherein the codeword detection state machine comprises four states with digital sum variation 1, 4, 5, and 8.

3. The method of claim 1, wherein the digital sum variation is formed in 2 bit intervals.

4. The method of claim 1, wherein the illegal state transition for the bounded digital sum variation (DSV) is between a state with DSV=8 to a state with DSV=5.

5. The method of claim 1, wherein the illegal state transition for the bounded digital sum variation (DSV) is between a state with DSV=8 to a state with DSV=4.

* * * * *

UNITED STATES PATENT AND TRADEMARK OFFICE
CERTIFICATE OF CORRECTION

PATENT NO. : 6,480,983 B2
DATED : November 12, 2002
INVENTOR(S) : Makoto Noda

It is certified that error appears in the above-identified patent and that said Letters Patent is hereby corrected as shown below:

Column 2,
Line 14, change "am" to -- an --;

Column 7,
Line 62, change "$X = X(P + \overline{Y}) + Y\overline{XP}$" to -- $X = X(P + \overline{Y}) + Y\overline{XP}$ --
$Y = \overline{Y} \oplus Q$ Signed and Sealed this Twenty-ninth Day of April, 2003

JAMES E. ROGAN
*Director of the United States Patent and Trademark Office*